(12) United States Patent
Coolbaugh et al.

(10) Patent No.: US 7,300,807 B2
(45) Date of Patent: Nov. 27, 2007

(54) STRUCTURE AND METHOD FOR PROVIDING PRECISION PASSIVE ELEMENTS

(75) Inventors: Douglas D Coolbaugh, Essex Junction, VT (US); Hayden C. Cranford, Jr., Cary, NC (US); Terence B. Hook, Jericho Center, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 10/709,109

(22) Filed: Apr. 14, 2004

(65) Prior Publication Data

US 2005/0233478 A1 Oct. 20, 2005

(51) Int. Cl.
*H01L 21/66* (2006.01)

(52) U.S. Cl. .................. 438/18; 257/538; 257/E21.004; 338/195

(58) Field of Classification Search .................. 438/18; 257/538, E21.004; 338/195
See application file for complete search history.

(56) References Cited

U.S. PATENT DOCUMENTS

| | | | |
|---|---|---|---|
| 3,656,115 A | | 4/1972 | Foerster |
| 3,983,528 A | * | 9/1976 | King ........................... 338/195 |
| 4,016,483 A | * | 4/1977 | Rudin .......................... 323/354 |
| 4,862,136 A | * | 8/1989 | Birkner ........................ 338/195 |
| 4,906,966 A | * | 3/1990 | Imamura et al. ............ 338/195 |
| 5,051,615 A | | 9/1991 | Rosenthal |
| 5,206,623 A | | 4/1993 | Rochette et al. |
| 5,235,335 A | | 8/1993 | Hester et al. |
| 5,394,019 A | * | 2/1995 | Audy .......................... 327/525 |
| 5,493,148 A | * | 2/1996 | Ohata et al. ................ 257/538 |
| 5,567,977 A | | 10/1996 | Jimenez |
| 5,757,264 A | * | 5/1998 | Petit ........................... 338/195 |
| 6,104,235 A | | 8/2000 | Monti et al. |
| 6,220,227 B1 | * | 4/2001 | Okada et al. ............... 123/509 |
| 6,237,131 B1 | * | 5/2001 | MacArthur et al. ........... 716/16 |
| 6,452,478 B1 | * | 9/2002 | Dale ........................... 338/195 |
| 6,489,881 B1 | | 12/2002 | Aleksandravicius et al. |
| 6,529,116 B2 | * | 3/2003 | Van Den Broek et al. .. 338/309 |

(Continued)

*Primary Examiner*—B. William Baumeister
*Assistant Examiner*—Steven J. Fulk
(74) *Attorney, Agent, or Firm*—Scully, Scott, Murphy & Presser, PC; Anthony J. Canale

(57) ABSTRACT

A circuit having a precision passive circuit element, such as a resistor or a capacitor, with a target value of an electrical parameter is fabricated on a substrate with a plurality of independent parallel-connected passive circuit elements. The plurality of passive circuit elements are designed to have a plurality of values of the electrical parameter which are spaced or offset at or around the target value of the electrical parameter, such as three circuit elements with one having a value at the target value, one having a value above the target value, and one having a value below the target value. Each passive circuit element also has a fuse in series therewith. A reference calibration structure is also fabricated, which can be a passive circuit element having the target value of the electrical parameter, in a reference area of the substrate under the same conditions and at the same time as fabrication of the plurality of passive circuit elements. The actual component value of the reference calibration structure is then measured, and based upon the measurement a single precision passive element of the plurality of parallel passive circuit elements is selected by blowing the fuses of, and thus deselecting, the other independent parallel connected passive circuit elements.

14 Claims, 1 Drawing Sheet

U.S. PATENT DOCUMENTS

| | | |
|---|---|---|
| 6,789,238 B2 * | 9/2004 | Swanson et al. ............... 716/4 |
| 6,875,950 B2 * | 4/2005 | Naumov et al. ....... 219/121.69 |
| 2002/0033519 A1 | 3/2002 | Babcock et al. |
| 2003/0034489 A1 * | 2/2003 | Bhattacharya et al. ........ 257/48 |
| 2004/0006755 A1 * | 1/2004 | Swanson et al. .............. 716/19 |

* cited by examiner

STRUCTURE AND METHOD FOR PROVIDING PRECISION PASSIVE ELEMENTS

BACKGROUND OF INVENTION

1. Field of the Invention

The present invention relates to semiconducting integrated circuits (ICs), and more particularly to a method of fabricating a precision passive element, such as a resistor, capacitor, diode or transistor, on a semiconductor substrate. The present invention is also directed to the semiconductor structure that is fabricated from the method of the present invention.

2. Background of the Invention

In the fabrication of electronic ICs, processing variations often prevent the manufacture of precision passive elements such as, for example, resistors and capacitors. Moreover, the manufacturing controls on processes for forming passive elements in complementary metal oxide semiconductor (CMOS) chips fall far short of circuit design requirements. Industry standard input and output (I/O) specifications are tighter than that which can be achieved in current manufacturing processing. Manufacturing excessive chips and then sorting them for required parameters is one possible solution; however, this is a costly solution and it is not consistent with current manufacturing techniques.

Another solution to the above mentioned problem is to use fuses for trimming passive elements. The prior art teaches the method of trimming devices based upon a circuit test. In this method, a circuit is tested and then an appropriate circuit element is selected. In this case, a measurement and feedback loop is required as well as a fuse scheme. Moreover, elements remaining in the circuit after fuse trimming can cause unwanted parasitic capacitance since they remain attached to the main circuit although not active.

A third known solution to the aforementioned problem is to design active controls into the semiconductor circuitry to compensate for manufacturing variability. This approach is problematic since the active controls formed into the semiconductor circuitry takes up space. Moreover, this third approach increases complexity of fabricating the semiconductor circuitry, and it can lead to trade-offs in device performance.

Co-assigned U.S. Application Publication No. 2002/0113297, which is based on U.S. Ser. No. 09/525,088, filed Mar. 14, 2000, represents one current advancement in the art of fabricating precision circuit elements. In particular, the circuit elements are fabricated as part of an integrated circuit assembly. The processing of the circuit elements is such to provide a nominal circuit element value close in value to the desired value. Additional trim circuit elements are joined to the nominal circuit element through links. The links are fusible links or antifuses. By selectively blowing the fusible links or fusing the antifuses, trim circuit elements are added or subtracted to personalize the value of the nominal circuit element.

In more general terms, U.S. Application Publication No. 2002/0113297 discloses the formation of multiple devices, including one primary device containing additional trim elements, in parallel that can be selectively added or removed to dial into a targeted performance characteristic. The foregoing published U.S. Application, however, does not describe how to determine which devices to select. Moreover, the parallel circuitry employed in the foregoing published U.S. Application can lead to excess capacitance.

In view of the above, it is an objective of the present invention to provide a structure and method for providing precision passive elements that overcome the shortcomings of the prior art mentioned above.

SUMMARY OF INVENTION

The present invention provides a set of multiple independent circuits, each entirely independent of the other circuits, which are selectable by fuses. In the present invention, target parameters are varied over the range of process variability for each independent circuit by varying target dimensions, for example. A measurement is then taken on a calibration structure on a semiconductor chip (or wafer, or lot) and then the most likely appropriate circuit element is selected; all other elements are deselected and removed from the circuit completely. In the present invention, a method for selecting elements is provided to insure precision using structures consistent with the device specifications for the passive element in question.

Typically, only one element per set will be electrically active (resistively or capacitively) after the selection and removal of the other elements of the set.

The inventive solution is preferred to the prior art sorting process because excess scrap costs are avoided. Moreover, the inventive solution is preferred to prior art laser trimming because only one measurement is necessary for a multitude of devices and desired circuitry can be selected without physical access to each device. With the prior art, contact for measurement and trimming would need to be done on individual devices. The present invention is also an improvement over the prior art method that employs an active control in circuitry, as minimal excess circuitry is required. Moreover, the present invention is an improvement over the technology disclosed in printed publication U.S. 2002/0113297 as it results in no excess capacitance after the desired device is selected.

In accordance with the method of the present invention, a first element is formed in a first region of a semiconductor substrate. The first element is a passive element, such as a thin film resistor, a MIM capacitor or a diode. This technique can also be applied to a selection of active devices such as a precision circuit requiring a precise threshold voltage for a FET transistor. Next, a plurality of second elements is formed in a second region of the semiconductor substrate. The plurality of second elements includes at least two other elements that are of the same type as the first element. Thus, when the first passive element is a resistor, the second passive elements include a plurality of resistors. The plurality of second passive elements includes individual elements that range in value about a value of the first element. The plurality of second elements is arranged such that the various elements behave as a single element in the structure.

The value of the first passive element is measured and then the measured value is compared to a target value. The targeted value represents the value that is required for a specific use as defined by a manufacturer and/or a customer. After the measuring and comparing steps, at least one of the individual elements within the plurality of second elements that is likely to best correspond to the result of the comparison is selected. The other passive elements from the plurality of second elements are deselected and are completely removed from the structure by blowing a fuse or fuses. Alternatively, the deselection can be achieved by welding antifuses.

The values of the second elements are designed to range above and/or below some pre-selected nominal or target value. A measurement of a calibration structure (the first element) is taken and thereafter the element or elements closest to the desired value are selected. In one embodiment in which two elements are designed at the top and bottom of the specification range, it is possible to reduce the final variability in the circuit element by a factor of two.

By way of example, if a 100 ohms resistor is desired, a series of resistors are designed at 100, 90 and 110 ohms, nominally. Next, the actual resistance of a calibration structure (the first element) in the inter-chip scribline region kerf is measured and the resistor in the actual chip that is likely to be closest to the target value is selected; the others are removed. This results in a precision of 5%, when the manufacturing process has a 10% tolerance.

The present invention also provides a structure that includes a first passive element located in a first region of a semiconductor substrate; and a plurality of second passive elements located in a second region of the semiconductor substrate, wherein said plurality of second passive elements is arranged to behave as a single element and each second element has a value (resistance or capacitance) that ranges about a value of a desired target value.

DETAILED DESCRIPTION

Figure 1:
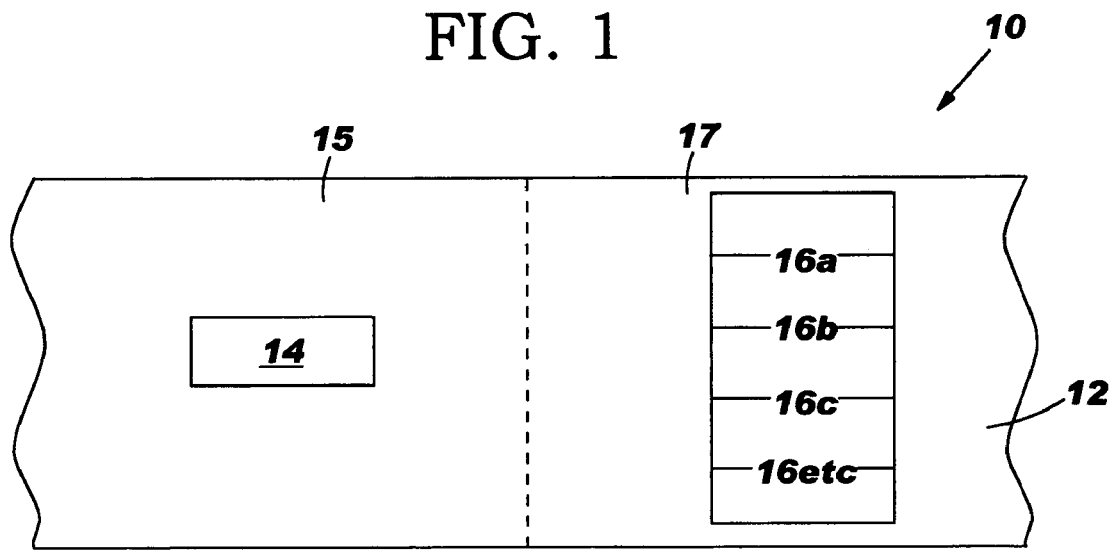
FIG. 1 is a simple schematic showing the structure of the present invention.

The present invention, which provides a structure and methodology of providing precision elements on a semiconductor substrate, will now be described in more detail by referring to the drawings that accompany the present application.

Reference is made to FIG. 1, which illustrates the basic structure that is provided and used in the present invention. As shown, the structure 10 includes a semiconductor substrate 12 that contains at least a first passive element (i.e., reference element) 14 located in a first region 15 of a semiconductor substrate 12 and a plurality of second passive elements 16a, 16b, 16c, 16 etc. located in a second region 17 of the semiconductor substrate 12. The plurality of second passive elements 16a, 16b, 16c, 16 etc. is arranged in a parallel manner such that the various elements behave as a single precision element. Each of the second passive elements 16a, 16b, 16c, 16 etc. are linked by fusible links or antifuses (not shown in this drawing).

The term "semiconductor substrate" is used in the present invention to denote any semiconductor material including, for example, Si, SiGe, SiC, SiGeC, GaAs, InAs, InP and other III/V compound semiconductors. Semiconductor substrate 12 may also comprise a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material. The semiconductor substrate 12 may be doped, undoped or contain doped and undoped regions therein. The semiconductor substrate 12 may be used in forming CMOS devices, bipolar devices or a combination of CMOS and bipolar devices. The exact types of devices that are formed are not critical to the present invention so long as the final structure requires a precision passive element therein.

The term "passive element" is used in the present invention to denote any integrated passive device including a resistor, a capacitor, or inductor. Active devices, such as transistors can be used as well.

The types of the passive elements are not important so long as each passive element within the structure is the same type, i.e., the first passive element and the plurality of second passive elements are composed of the same element. In one preferred embodiment, which will be outlined in more detail below, the passive elements are resistors.

The passive elements (14 and 16a, 16b, 16c, 16 etc.) are formed utilizing any conventional process that is capable of forming a passive element.

The active devices are formed utilizing conventional processes as well.

The number of second passive elements contained within the plurality of second elements may be variable so long as at least two or more, preferably three or more, are present. The plurality of the devices allows for a definite level of precision, as more elements are added, more precision can be obtained. In the example below, three passive resistors, are shown. In accordance with the present invention, each individual passive element with the plurality of second passive elements has a value (i.e., resistance, or capacitance) that ranges about a value of the desired target value.

The value of the first passive element within the structure can vary depending on the type of passive element employed.

The range of values of the second passive elements may vary across a wide range that is nominally equal to the value of the desired target, less than the value of the desired target, and/or greater than the target value. When the individual element of the second passive element is nominally less than the value of the target, the value of the second passive element can be from about 1 to about 30%, preferably from about 5% to about 20%, less than the value of the target. When the individual element of the second passive element is greater than the value of the first passive element, the value of the second passive element can be from about 1 to about 30%, preferably from about 5% to about 20%, greater than the value of the target.

In one embodiment of the present invention, the plurality of second passive elements comprise an element that has a value that is about equal to the value of the target, an element having a nominal value of about 10% less than the value of the target, and an element having a nominal value that of about 10% greater than the value of the target.

After providing the first and second passive elements within the semiconductor substrate 12, the value of the first passive element 14 is measured using techniques that are well known to those skilled in the art. The technique used to measure the value of the first passive element is dependent on the type of element used. For example, when a resistor is employed as the first passive element, a parameter analyzer can be used to measure its resistance. When a capacitor is employed as the first passive element, an LCR meter can be used to measure its capacitance. A parameter analyzer can be used to measure the threshold voltage or transconductance of first element when it is a transistor and a parameter analyzer can be used to measure the forward voltage of a diode.

The measured value obtained is then compared to a target value desired by a manufacturer or customer, which meets a predetermined specification. The comparison can be performed manually or an electronic comparison can be used.

After comparing the measured value of the first passive element to a targeted value, at least one individual element within the plurality of second passive elements is selected that is most likely to correspond to the desired target value. The other individual elements within the plurality of second passive elements are deselected and can be removed by blowing the fusible links or by fusing the antifuses that are present in the plurality of second elements. The fusible link and antifuses are made of materials well known to those skilled in the art and the blowing or fusing of the specific material is performed using techniques that are also well known in the art.

In one embodiment of the present invention, when the measured value of the first element is greater than a targeted value, the individual element having a nominal value of about 10% less than the target value is selected. In another embodiment of the present invention, when the measured value of the first element is less than a targeted value, the individual element having a nominal value of about 10% greater than the target value is selected.

The method of the present invention, which has been described above, provides a means for forming a precision element on a semiconductor substrate.

In applications where a precision circuit element is required in an interconnect assembly, a plurality of circuit elements are formed that are linked together by fusible links, with each circuit element being designed with an offset in its designed electrical parameter. The fusible links allow any one of the plurality of circuit elements to be selected as the final circuit element.

In one embodiment, a reference circuit element is fabricated under the same conditions and at the same time as the desired precision circuit elements. The reference circuit element is tested to determine its actual component value of the electrical parameter and which circuit element is selected for use. One or more reference circuit elements may be formed for a large group or number of precision circuit elements.

Figure 2:
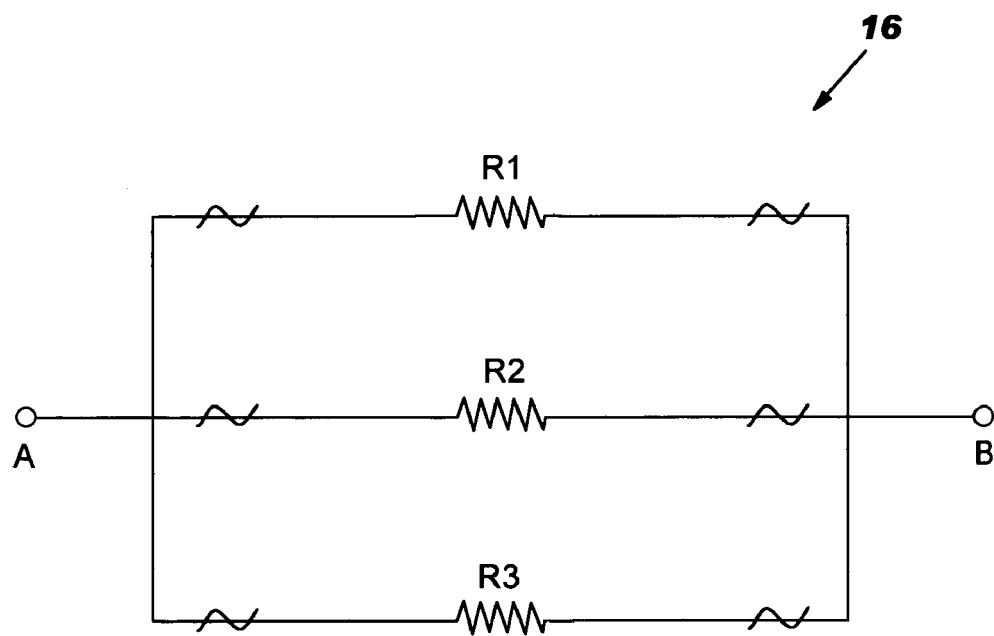
FIG. 2 illustrates an exemplary embodiment of the present invention wherein three resistors, R1, R2, and R3 are used to form one precision resistor element between nodes A and B.

As a first illustrative embodiment, FIG. 2 shows three resistors, R1, R2 and R3 which are used to form one precision target resistance between nodes A and B, a first resistor R2 nominal targeted for the nominal target resistance, a second resistor R1 which is offset with a higher resistance than the target resistance, and a third resistor R3 which is offset with a lower resistance than the target resistance. In FIG. 2, reference numeral 20 refers to the fusible links or the antifuses.

If the manufacturing process produces a reference resistor R (not shown) that is below the target resistance by an amount that is equal to more than half the offset between the resistors, then the R1 resistor is selected for use, and the other two resistors are isolated from the circuitry by blowing the fuses connected in series with the other two resistors. Similarly, if the manufacturing process produces a reference resistor R (not shown) that is above the target resistance by an amount that is equal to more than half the offset between the resistors, then the R3 resistor is selected for use, and the other two resistors are isolated from the circuitry by blowing the fuses connected in series therewith.

By one of example, if a final variability of better than ±8% is required and the normal process variability was ±20%, three elements could be used, one targeted at the nominal parameter value, another targeted at +13.3% and the third targeted at 13.3%. Regardless of where the normal ±20% process variation was running, one of the elements would be within 7% of the target value.

In general, by using the method of the present invention the process variability can be reduced by a factor of the number of offset elements formed; selecting between two elements improves the process window by a process of 2, selecting three between three elements improves the process window by a factor of 3, . . . etc. The preferred target offset expressed as a fraction of the process viability in either direction around nominal is 2/N, where N is the number of off-setting elements within the plurality of second passive elements. For odd numbers of elements, there would be one element at the nominal targeted value and the next elements would be offset 2/N of nominal in either direction. For even numbers of circuit elements, no circuit element is formed at the nominal value, the two circuit elements are spaced 2/N apart, centered about the nominal target value (each 1/N from the nominal target value) and additional circuit elements, if any, are offset 2/N from the first two circuit elements.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

The invention claimed is:

1. A method of forming a precision element on a semiconductor substrate comprising:

forming a first element comprising a calibration structure in a first region of a semiconductor substrate;

forming a plurality of second elements in a second region of the substrate, the plurality of second elements comprising individual elements, the individual elements ranging in value about a desired value, wherein the plurality of second elements comprise one element having a nominal value about equal to the desired value, another element having a value of about 10% less than the desired value, and a further element having a nominal value of about 10% greater than the value of the desired element;

measuring the value of the first element;

comparing the measured value to a target value; and selecting at least one of the individual second elements corresponding to the result of the comparison to provide a precision element comprised of the at least one selected individual second element that has said target value, wherein when the measured value of the first element is greater than the target value, the element having a nominal value of about 10% less than the desired value is selected.

2. A method of forming a precision element on a semiconductor substrate comprising:

forming a first element comprising a calibration structure in a first region of a semiconductor substrate;

forming a plurality of second elements in a second region of the substrate, the plurality of second elements comprising individual elements, the individual elements ranging in value about a desired value, wherein the plurality of second elements comprise one element having a nominal value about equal to the desired value, another element having a value of about 10% less than the desired value, and a further element having a nominal value of about 10% greater than the value of the desired element;

measuring the value of the first element;

comparing the measured value to a target value; and selecting at least one of the individual second elements corresponding to the result of the comparison to provide a precision element comprised of the at least one selected individual second element that has said target value, wherein when the measured value of the first element is less than a predetermined target value, the element having a nominal value of about 10% greater than the desired value is selected.

3. A method of forming a precision element on a semiconductor substrate comprising:

forming a first element comprising a calibration structure in a first region of a semiconductor substrate;

forming a plurality of second elements in a second region of the substrate, the plurality of second elements comprising individual elements, the individual elements ranging in value about a desired value, wherein the plurality of second elements comprise one element having a nominal value about equal to the desired value, another element having a value of about 10% less than the desired value, and a further element having a nominal value of about 10% greater than the value of the desired element;

measuring the value of the first element;

comparing the measured value to a target value; and selecting at least one of the individual second elements corresponding to the result of the comparison to provide a precision element comprised of the at least one selected individual second element that has said target value, wherein when the measured value of the first element is equal to the predetermined target value, the element having a value about equal to the value is selected.

4. A method of forming a precision element on a semiconductor substrate comprising:

forming a first element comprising a calibration structure in a first region of a semiconductor substrate;

forming a plurality of second elements in a second region of the substrate, the plurality of second elements comprising individual elements, the individual elements ranging in value about a desired value, wherein the plurality of second elements comprise one element having a nominal value about equal to the desired value, another element having a value of about 10% less than the desired value, and a further element having a nominal value of about 10% greater than the value of the desired element;

measuring the value of the first element;

comparing the measured value to a target value; and selecting at least one of the individual second elements corresponding to the result of the comparison to provide a precision element comprised of the at least one selected individual second element that has said target value.

5. The method of claim 4 wherein when the measured value of the first element is greater than the target value, the element having a nominal value of about 10% less than the desired value is selected.

6. The method of claim 4 wherein when the measured value of the first element is less than a predetermined target value, the element having a nominal value of about 10% greater than the desired value is selected.

7. The method of claim 4 wherein when the measured value of the first element is equal to the predetermined target value, the element having a value about equal to the value is selected.

8. The method of claim 4 wherein the first and the second elements include a passive element selected from the group consisting of a resistor, a capacitor, a diode and a transistor.

9. The method of claim 4 wherein the first and the second elements are resistors.

10. The method of claim 4 wherein said plurality of second elements is arranged in parallel to each other.

11. The method of claim 4 wherein said plurality of second elements comprise thee resistors that are arranged in parallel to each other.

12. The method of claim 4 wherein said plurality of second element is linked by fusible links or antifuses.

13. The method of claim 4 wherein said comparing is performed manually or electronically.

14. The method of claim 4 wherein the selecting includes a step of removing other second elements that are not selected by blowing fusible links or by fusing antifuses that are present within said plurality of second elements.

* * * * *